United States Patent [19]

Nakamura

[11] 4,367,371
[45] Jan. 4, 1983

[54] ELECTRONIC PART WITH AN INSULATING COVER

[75] Inventor: Toshinobu Nakamura, Tokyo, Japan

[73] Assignee: Shinagawa Shoko Co., Ltd., Tokyo, Japan

[21] Appl. No.: 255,044

[22] Filed: Apr. 17, 1981

Related U.S. Application Data

[63] Continuation of Ser. No. 139,201, Apr. 11, 1980, abandoned.

[51] Int. Cl.³ .................. H05K 5/03; H01G 1/035
[52] U.S. Cl. .................. 174/52 R; 150/52 R; 174/138 G
[58] Field of Search ............ 174/50.51, 52 R, 74 A, 174/138 F, 138 G; 150/52 R, 52 L; 338/226; 339/36, 116 R, 116 C; 361/272, 400, 403; D13/21; 200/302; 206/328

[56] References Cited

U.S. PATENT DOCUMENTS

| 2,714,912 | 8/1955 | Gonnella | 150/52 R |
| 2,792,444 | 5/1957 | Bergan | 174/138 F X |
| 3,132,202 | 5/1964 | Wolf | 174/138 F X |
| 3,272,908 | 9/1966 | Beecher | 174/138 G X |
| 3,541,230 | 11/1970 | Kramer | 174/52 R X |
| 3,684,817 | 8/1972 | Card, Jr. et al. | 174/138 G X |

FOREIGN PATENT DOCUMENTS

| 566100 | 8/1975 | Switzerland | 174/52 R |
| 1072347 | 6/1967 | United Kingdom | 174/138 G |

Primary Examiner—Laramie E. Askin
Attorney, Agent, or Firm—Fidelman, Wolffe & Waldron

[57] ABSTRACT

An insulating cover formed of a synthetic resin material to be placed, as necessary, over an electronic part which has been automatically mounted on a printed circuit substrate. The insulating cover can be installed on the part easily and with proper fit, has good insulating properties and provides dust and sound proofing functions. The cover cannot be freely slipped off of the part by vibration and the like.

1 Claim, 13 Drawing Figures

ELECTRONIC PART WITH AN INSULATING COVER

This application is a continuation of application Ser. No. 139,201 filed Apr. 11, 1980, now abandoned.

The present invention relates to insulating covers for electronic parts, and more specifically to electronic parts mounted on a printed circuit substrate, for example, glass fuse tubes, capacitors, resistors, transistors, diodes, semiconductors, and various other electronic parts such as integrated circuits (IC), large scale integrated circuits (LSI), micro-lead relays or micro-lead switches.

In recent practice, mounting of various electronic parts on the printed circuit substrate has been automatically achieved by means of an automatic part inserting machine or the like controlled by a computer. It has been impossible to effect automatic insertion of an electronic part requiring an insulating cover onto a printed circuit substrate while such a cover is in place thereon.

In view of the above-mentioned disadvantage, the present invention provides an insulating cover which can be installed on electronic parts after those electronic parts have been automatically mounted on the printed circuit substrate; an electronic part requiring the insulating cover among said electronic parts mounted on the circuit board may have the cover installed in an easy and proper manner. The installed cover provides insulation for a long period of time, provides dust proofing and sound proofing functions and cannot be slipped off the part due to vibrations, other external forces and the like. The cover is very simple in construction and installation and is extremely inexpensive.

It is therefore an object of the present invention to provide an insulating cover which can be installed on various electronic parts easily and properly.

It is another object of the present invention to provide an insulating cover which can afford good insulation for a long period of time, has dust proofing and sound proofing functions and cannot be slipped off due to external forces or the like.

It is a further object of the present invention to provide an insulating cover which is extremely inexpensive.

Other objects and advantages of this invention will become apparent from the following description taken in conjunction with the accompanying drawings, in which.

Specific embodiments of the present invention will be described hereinafter with reference to the accompanying drawings.

Figure 1:
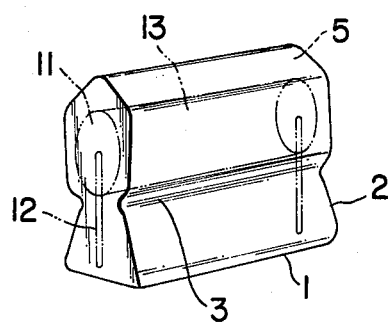
FIG. 1 is a perspective view showing a preferred embodiment of an insulating cover for use with a glass fuse tube as an electronic part.
Figure 2:
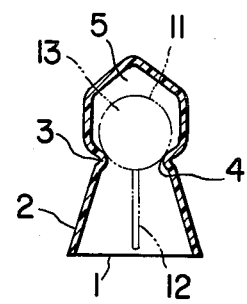
FIG. 2 is a longitudinal sectional view of FIG. 1.
Figure 3:
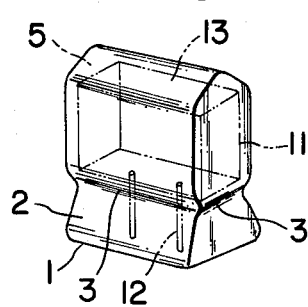
FIG. 3 is a perspective view showing a preferred embodiment of an insulating cover for use with a capacitor as an electronic part.
Figure 4:
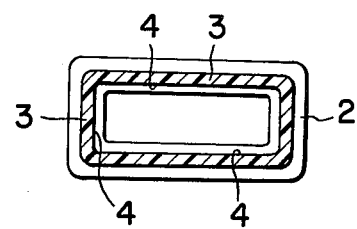
FIG. 4 is a cross sectional view of FIG. 3.
Figure 5:
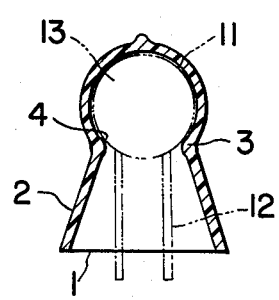
FIG. 5 is a longitudinal sectional view showing a preferred embodiment of another insulating cover for a capacitor different in shape from the capacitor shown in FIG. 3 as an electronic part.
Figure 6:
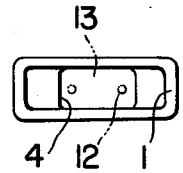
FIG. 6 is a bottom view of FIG. 5.
Figure 7:
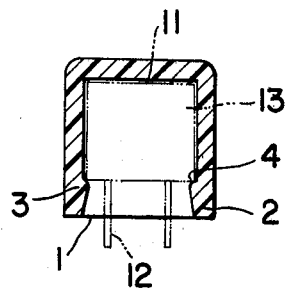
FIG. 7 is a longitudinal sectional view showing a preferred embodiment of an insulating cover for use with semiconductors such as a transistor, diode or similar semiconductor as an electronic part.
Figure 8:
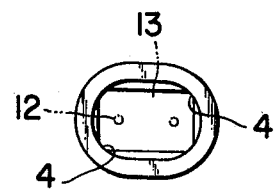
FIG. 8 is a bottom view of FIG. 7.
Figure 9:
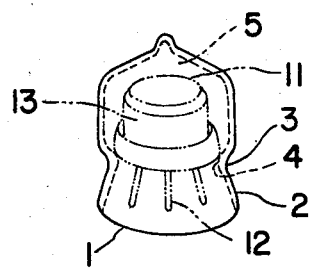
FIG. 9 is a perspective view showing a preferred embodiment of another insulating cover for use with a semiconductor different in shape from the semiconductor shown in FIG. 7 as an electronic part.
Figure 10:
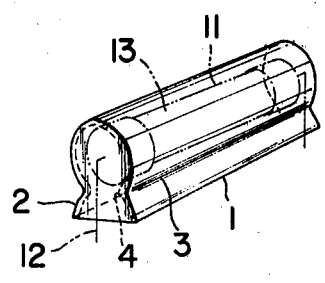
FIG. 10 is a perspective view showing a preferred embodiment of an insulating cover for use with a resistor as an electronic part.
Figure 12:
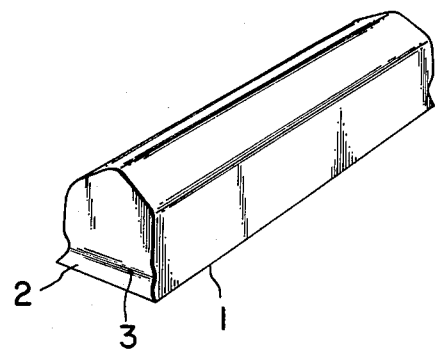
FIG. 12 is a perspective view showing a preferred embodiment of an insulating cover for use with IC, LSI, micro-lead relay or micro-lead switch as an electronic part.
Figure 13:
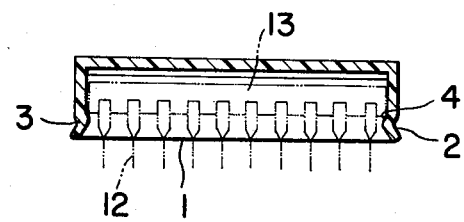
FIG. 13 is a longitudinal sectional view of FIG. 12.

First, an electronic part 11, on which an insulating cover has been or is to be placed, includes, for example, a glass fuse tube shown in FIG. 1, capacitors shown in FIGS. 3 and 5, semiconductors such as a transistor, diode or similar semiconductor shown in FIGS. 7 and 9, a resistor shown in FIG. 10, and IC, LSI, micro-lead relay, and micro-lead switch shown in FIG. 12.

The insulating cover comprises a side wall 2 disposed in a continuous upright attitude substantially in the form of a skirt extending upwardly from an open base 1. The base 1 is of dimension and shape for easy egress and ingress of the electronic part 11 to encircle a lead wire 12 of the electronic part. A supporting ledge 4 is formed wholly or partly as an integral inner portion of wall 2 and is provided with a constricted neck 3. Neck 3 is dimensioned so as to allow constrained passage of body 13 of the electronic part into place within hollow portion 5 which is of size and shape to accommodate body 13 and to thereafter grippingly support a lower edge portion of the body 13. Preferably, the insulating cover in accordance with the present invention is entirely integrally molded by means of a dip mold or the like using a synthetic resin material such as soft polyvinyl chloride.

Figure 11:
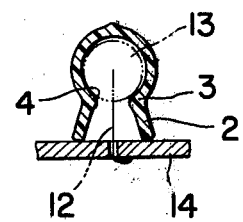
FIG. 11 is a longitudinal sectional view of FIG. 10 showing, in addition, a printed circuit substrate upon which the resistor is mounted.

It will be noted that various dimensions including height, size, capacity and the like of the lead wire 12 of the electronic part 11, the side wall portion 2 for encircling the lead wire and the hollow portion 5 are predesigned and determined by each part from a level of a printed circuit substrate 14 (see FIG. 11; the printed circuit boards in the other embodiments are not illustrated) as shown in respective embodiments, and accordingly, the electronic part 11 can be automatically mounted. That is, at the time of design, a mold is provided by determination of dimensions of parts whereby an insulating cover without unevenness in dimension of product may be molded.

Moreover, the whole insulating cover is integrally molded from a synthetic resin material such as soft polyvinyl chloride so that the insulating cover may be installed on an electronic part with ease to properly encircle the part; to provide insulation for a long period of time; to perform dust and sound proofing functions, and to positively prevent the cover from being slipped off due to vibrations and other external forces. In addition, the present invention is extremely advantageous in that insulating covers may be produced in volume, are very simple to install, are extremely inexpensive and consistent in result.

What is claimed is:

1. An electronic module for mounting on a circuit board, said module comprising an electronic part and an insulating cover, said electronic part having a body portion and lead wires and being adapted to be mounted on and spaced from a circuit board by means of said lead wires; said cover molded of a resilient insulating material and having an open base with terminal edges defining a plane and having upstanding side walls terminating in a closed top to form a chamber of size and shape accommodating therein the body portion of said electronic part; a circumferentially continuous ledge formed as an integral inner portion of said side walls, said ledge forming a constricted neck dimensioned so as to allow constrained passage of the body portion of said electronic part and to grippingly support a lower edge of said body portion, said side walls dimensioned such that said plane defined by the terminal edges of said open base is adapted to sealingly seat on a circuit board to totally enclose and insulate the lead wires of said electronic part; said side walls having substantially uniform wall thickness and at least a portion thereof flared outwardly from said constricted neck to said terminal edges, said outwardly flared portion imparting sufficient structural strength to said resilient material cover to support said body portion in a spaced relation from said circuit board by said ledge.

* * * * *